United States Patent [19]
Tonnel

[11] 4,420,379
[45] Dec. 13, 1983

[54] METHOD FOR THE FORMATION OF POLYCRYSTALLINE SILICON LAYERS, AND ITS APPLICATION IN THE MANUFACTURE OF A SELF-ALIGNED, NON PLANAR, MOS TRANSISTOR

[75] Inventor: Eugene Tonnel, Paris, France

[73] Assignee: Thomson-CSF, Paris, France

[21] Appl. No.: 187,960

[22] Filed: Sep. 16, 1980

[30] Foreign Application Priority Data

Sep. 18, 1979 [FR] France ................................. 79 23242

[51] Int. Cl.$^3$ ............................................. C25D 11/32
[52] U.S. Cl. ..................................... 204/38 A; 29/571; 29/584
[58] Field of Search ................. 204/38 A, 56; 29/584, 29/571, 580

[56] References Cited

U.S. PATENT DOCUMENTS

| 3,345,274 | 10/1967 | Schmidt | 204/15 |
| 3,438,873 | 4/1969 | Schmidt | 204/35 |
| 3,634,204 | 1/1972 | Dhaka et al. | 204/15 |
| 3,764,491 | 9/1973 | Schwartz | 204/56 R |

Primary Examiner—John F. Niebling
Assistant Examiner—William Leader
Attorney, Agent, or Firm—Cushman, Darby and Cushman

[57] ABSTRACT

A method for forming a self-aligned MOS power transistor. A layer of silicon nitride is deposited uniformly over a plate with limited oxide zones. The plate is then placed in an acid bath and subjected to a potential difference. Only the zones of the polycrystalline silicon layer which are over the silica zones remain.

6 Claims, 19 Drawing Figures

FIG_1
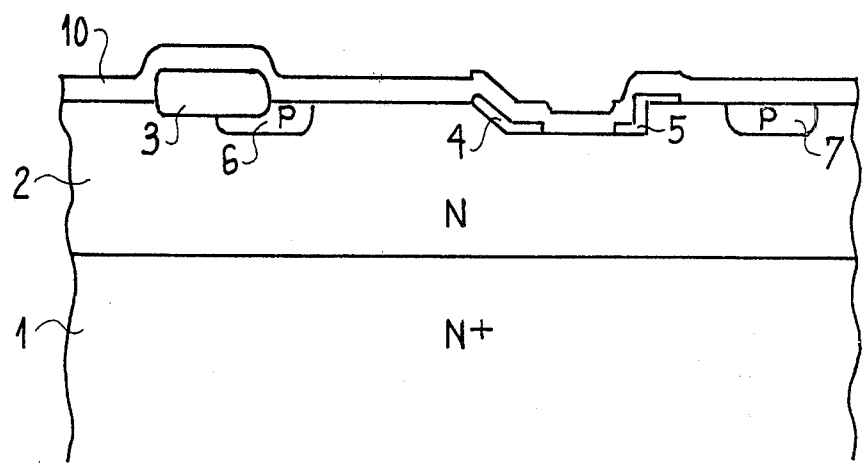
FIG_2
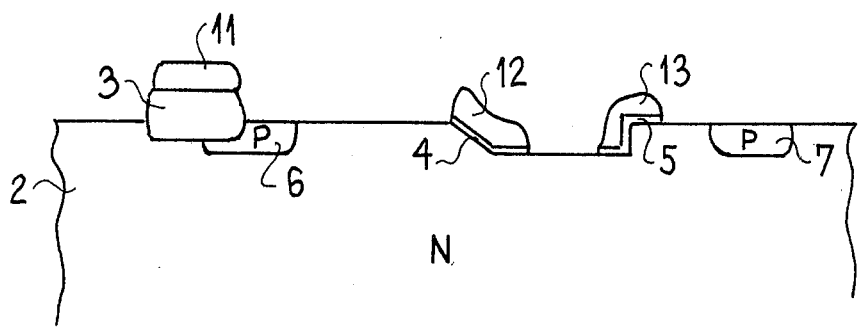

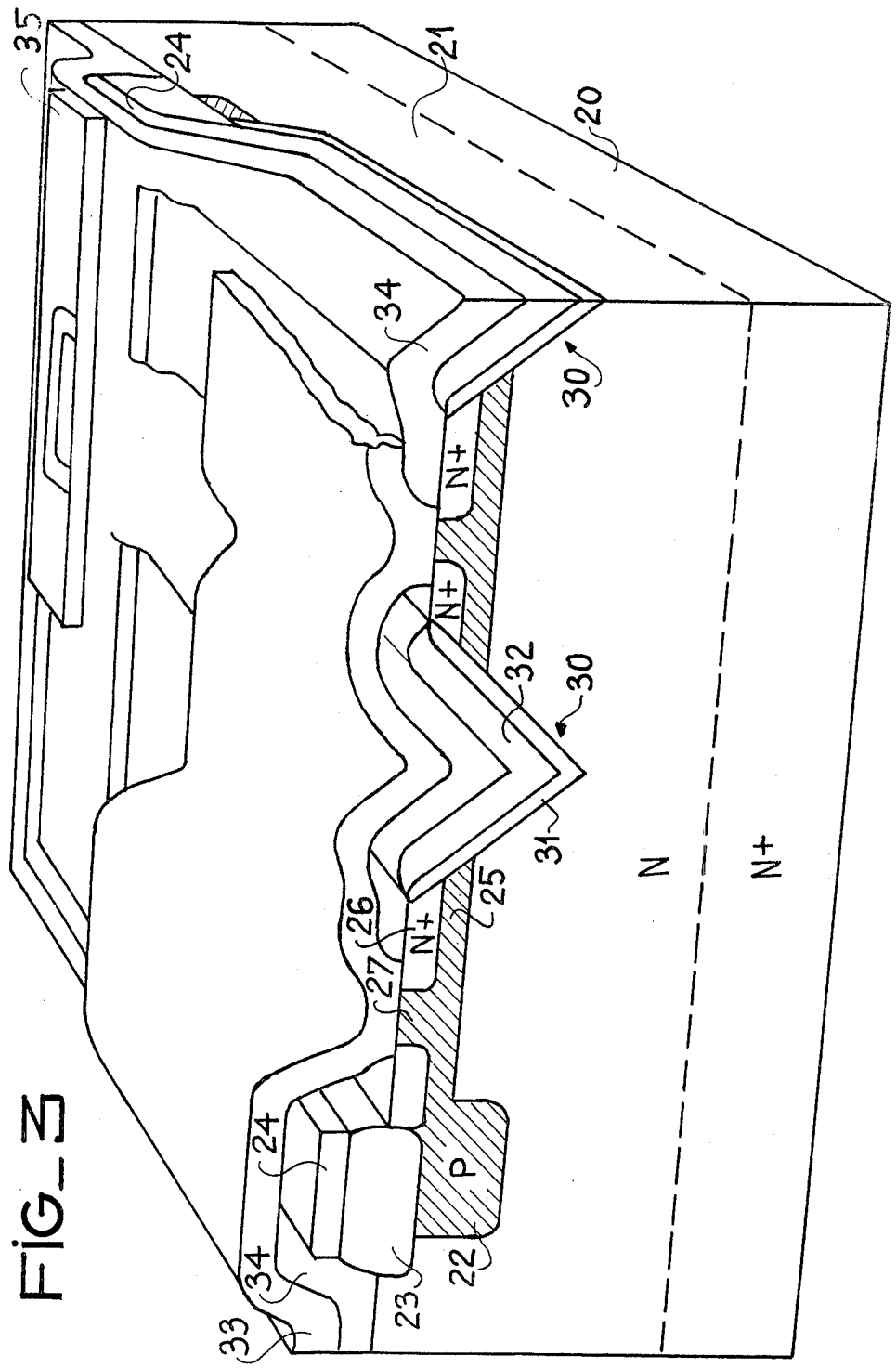
FIG_3

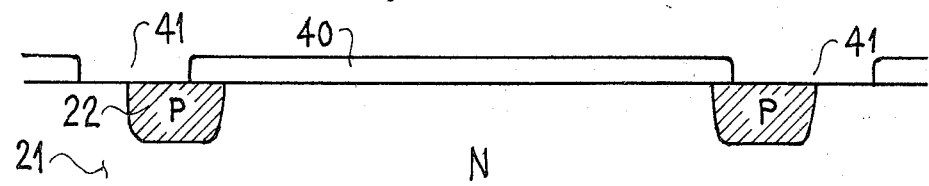
FIG_4
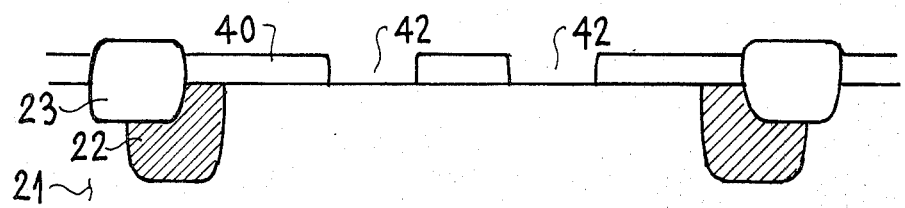
FIG_5
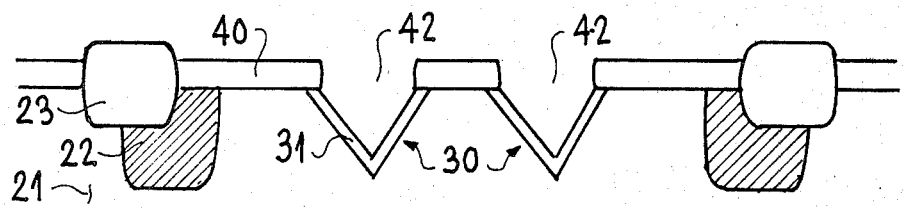
FIG_6
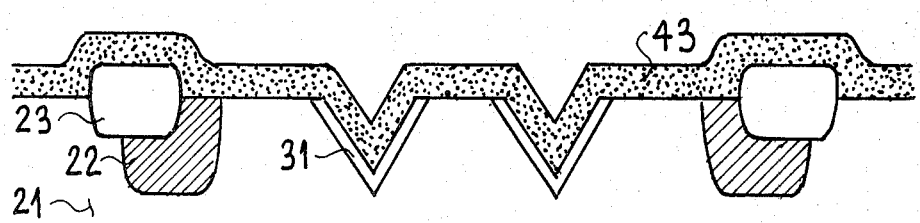
FIG_7
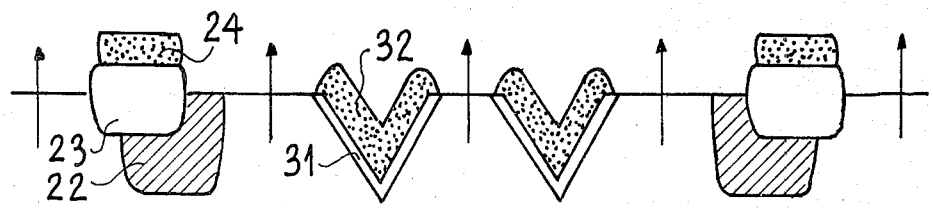
FIG_8

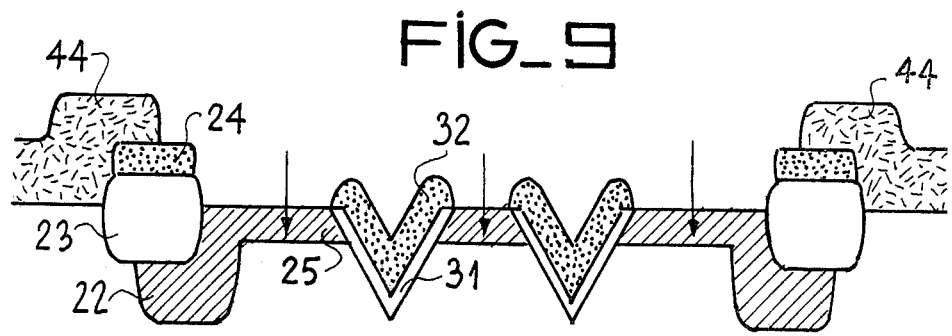
FIG_9
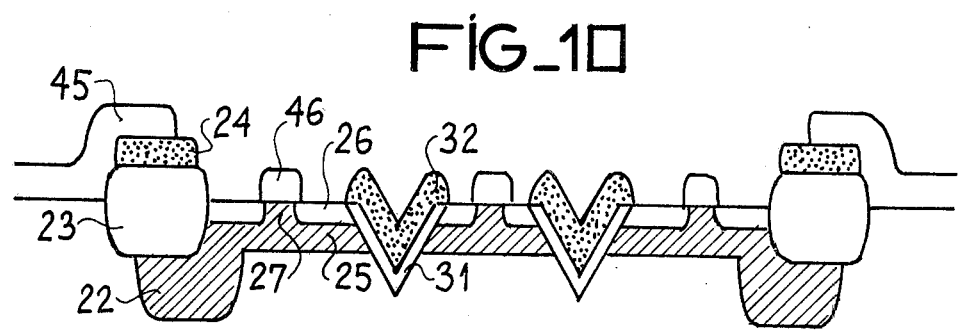
FIG_10
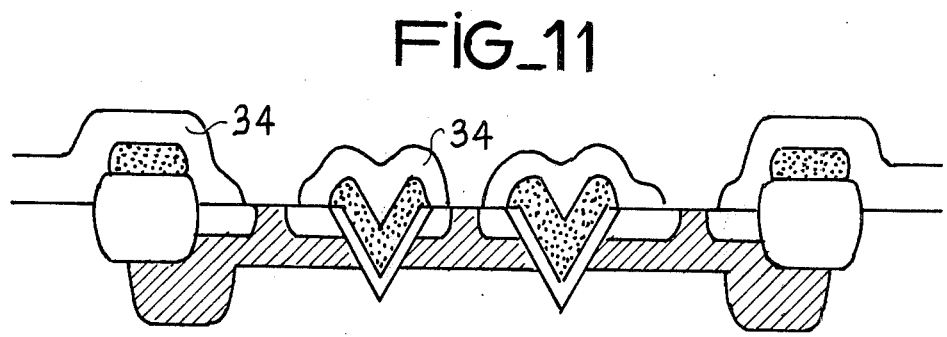
FIG_11
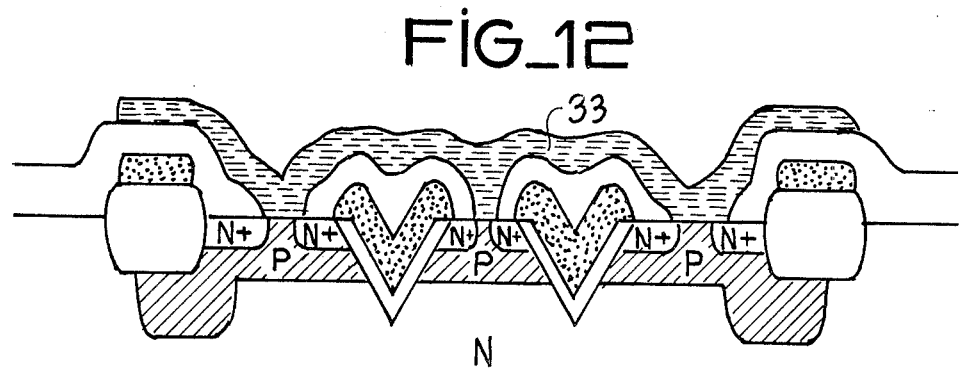
FIG_12

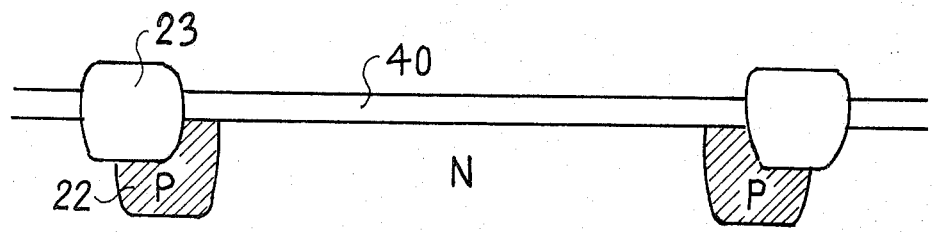
FIG_13
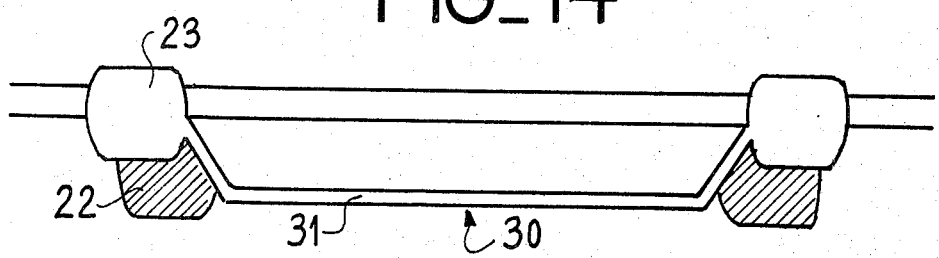
FIG_14
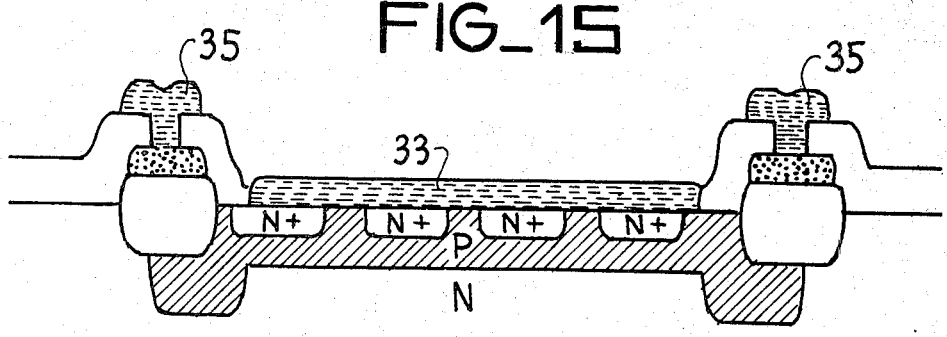
FIG_15
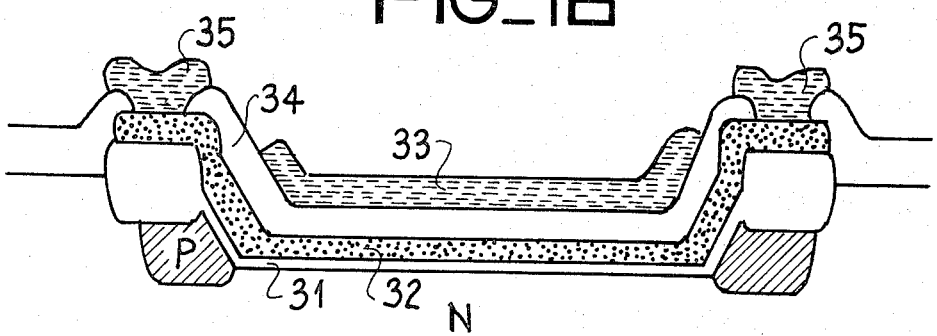
FIG_16

FIG_17
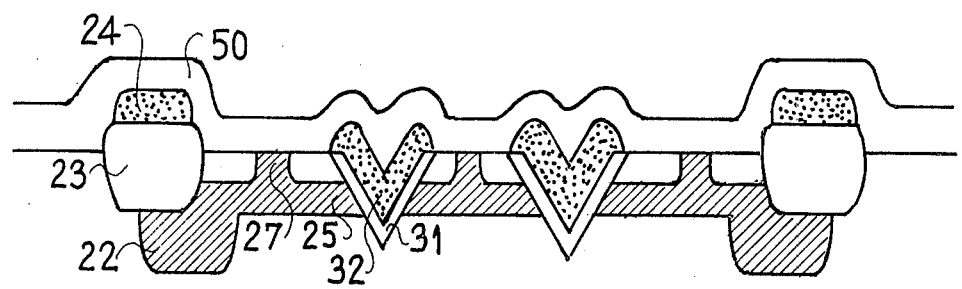
FIG_18
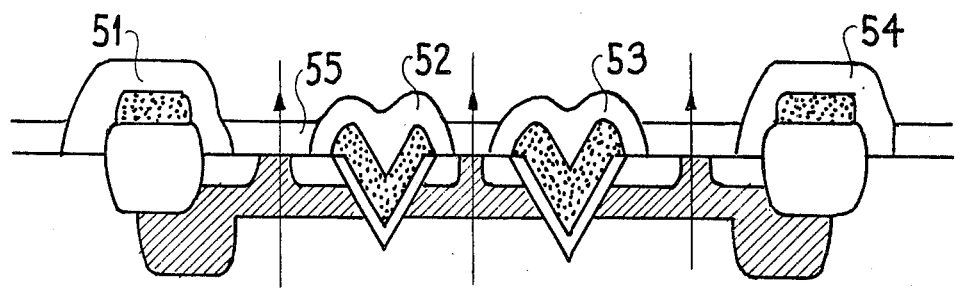
FIG_19
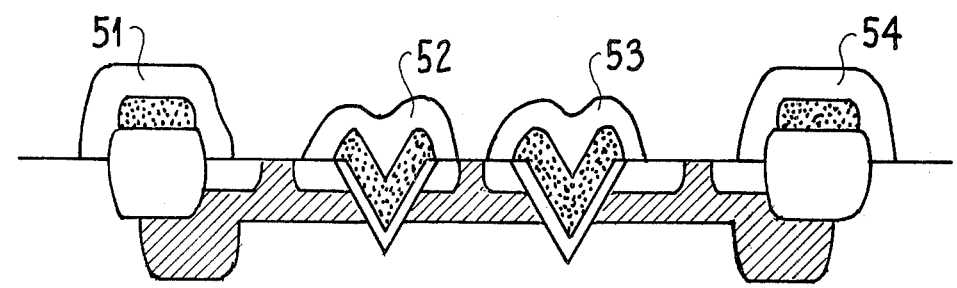

4,420,379

METHOD FOR THE FORMATION OF POLYCRYSTALLINE SILICON LAYERS, AND ITS APPLICATION IN THE MANUFACTURE OF A SELF-ALIGNED, NON PLANAR, MOS TRANSISTOR

BACKGROUND OF THE INVENTION

The present invention covers a method for the formation of polycrystalline silicon layers, which are localized onto zones covered with silica of a silicon plate, and a particular application of this process to the manufacture of a self-aligned, non planar, MOS device.

In the present description, the term "non planar MOS" is used to represent a field effect device which includes in particular the types currently called V-MOS and U-MOS transistors. The abbreviation "MOS" consists of the initials of the words metal-oxide-semiconductor". "V-MOS" indicates a MOS with V-shaped slots and "U-MOS" one with U-shaped ones. These V-MOS and U-MOS transistors operate vertically or roughly vertically and may be used in particular for applications in which relatively high voltages are applied and relatively high currents flow.

Generally speaking, in semiconductor component manufacture techniques, and more especially in integrated circuit manufacture techniques, the greatest possible miniaturization of the various elements is sought. To obtain this miniaturization, use is currently made of so-called self-aligning methods, i.e. methods which avoid using successive masks and enable several successive operations to be carried with one initial mask, these operations aligning themselves automatically on the designs determined by the initial mask.

OBJECTS OF THE INVENTION

Among these self-aligning techniques, one object of the present invention is to provide a method for automatically aligning the formation of polycrystalline silicon layers on silicon oxide layers which were previously formed on the surface of a monocrystalline silicon plate.

Another object of the present invention is to enable this method to be applied to the manufacture of structures such as non planar MOS transistors.

SUMMARY OF THE INVENTION

Hence, the method in accordance with the present invention for forming polycrystalline silicon layers on zones covered with silica on a silicon plate includes the following steps:
depositing a polycrystalline silicon layer uniformly on one face of the plate,
anodizing the plate by dipping it in an acid bath and causing a current to circulate in it between its rear face and an electrode placed in the bath.

The acid bath may be an aqueous solution of dilute hydrofluoric acid. The anodizing may be carried out in the presence of light. The anodizing is done at more or less high current level as a function of the bath chosen and of possible lighting in order to either convert the polycrystalline silicon into porous silicon in the zones not covered with silicon oxide or eliminate completely the polycrystalline silicon layer in these zones.

In accordance with the present invention, one application of the above method in the manufacture of a non planar MOS transistor structure from a silicon plate contains the following successive steps: formation in the plate of slots covered with a silicon oxide layer; use of the above method for removing polycrystalline from the regions not coverd with silicon oxide; successive steps of implantation, diffusion and masking which use the polycrystalline silicon formed on the silica as the limit of the implantation mask on one side and on the other of the slots to produce a classical non planar MOS structure; the usual metallizations and connections.

It will be noted that this method differs considerably from the usual methods for manufacturing non planar MOS transistors in which the slot was produced after the formation by implantation or diffusion of the channel and source forming layers. These methods did not allow self-alignment of the polycrystalline silicon grid layer in the slot.

DESCRIPTION OF THE DRAWINGS

These objects, characteristics and advantages together with others of the present invention will be explained in detail in the following description of preferred embodiments with reference to the figures attached in which:

FIGS. 1 and 2 show in section two stages in the method for self-alignment of the polycrystalline silicon on the limited silica layers on a silicon plate, FIG. 3 shows, in a sectioned perspective view, a power V-MOS transistor structure that is to be manufactured by the process in accordance with the present invention, FIGS. 4 to 12 are schematic sectional views in a plane perpendicular to the slot plane in FIG. 3 which are intended to show successive stages in the manufacture of the device in FIG. 3.

FIGS. 13 to 16 are sectional views in a plane parallel to the direction of the slots in the structure in FIG. 3 at various stages in manufacture, FIGS. 17 to 19 show a particular way of producing the stages already shown in FIGS. 10 and 11.

DESCRIPTION OF THE PREFERRED EMBODIMENTS

FIG. 1 shows a silicon plate containing a zone 1 of type N+ covered with a zone 2 of type N. On the surface of type N layer 2 are formed limited silica (SiO$_2$) zones 3, 4 and 5 by any suitable method. As an example, silica zone 3 is shown as a thick layer of thermal silica and layers 4 and 5 as relatively thin layers of thermal or pyrolitic silica deposited at places on the surface where layer 2 is not plane. Silica layer 4 is deposited at a place where the surface has a sloping side and layer 5 at a place where the surface is of stepped shape. In FIG. 1 limited type P zones 6 and 7 are also shown which result, for example, from diffusions or implantations in layer 2. Type P zone 6 is shown partly covered with silica layer 3 whereas type P layer 7 is shown not covered with a silica layer.

Hence, to achieve the object of the present invention, i.e. to cover with polycrystalline silicon only oxide zones 3, 4 and 5 on a structure containing layers and zones 1 to 7 illustrated in FIG. 1, the following steps are carried out:

In the first step, a uniform layer of not-doped polycrystalline silicon 10 is deposited.

In the second step, the silicon plate is placed in an acid bath with one electrode fixed to the rear face of the plate (N+ face) and the other electrode being a platinum one, for example, fitted in the bath. The electrode on the rear face is, for example, formed by a sucker creating a vacuum which holds the plate and protects it from contact with the bath.

By this method, as a function of the current passing through the plate, the polycrystalline silicon is converted either into a substance which dissolves in the acid bath or into porous silicon in the zones not-covered with oxide on the type N plate. A special problem arises in the case in which there are P zones such as zones 6 and 7 in area N. Then, the current has less tendency to pass through these zones because of the inverse diode effect of the NP junctions. To overcome this difficulty, the front face of the plate is subjected to strong light and carriers are then produced at the junction which alleviate the rectifier effects of this junction.

As a first numerical example: a plate covered with a 0.5 micron thick polycrystalline silicon layer was placed in a 2% hydrofluoric acid bath and a layer of porous silicon was obtained in 3 minutes with a current density of 5 mA/cm$^2$. This porous silicon layer can then be oxidized. This was obtained in the example given by processing in water vapour at 970° C. for 15 minutes.

All other things being equal (2% hydrofluoric acid aqueous solution and 0.5 micron polycrystalline silicon thickness), anodic dissolution of the polycrystalline silicon was obtained in 15 seconds of processing with a current density of 100 mA/cm$^2$.

Tests have also been carried out by varying the bath concentration and, with a 15% hydrofluoric acid bath, satisfactory results were obtained but they were slower. To accelerate the process in the case in which there is no NP junction and allow a satisfactory process in the case in which there is an NP junction, the front face of the plate was lighted.

The results of the tests described show that, by suitable choice of the anodizing current, either the structure shown in FIG. 2 is obtained in which polycrystalline silicon zones 11, 12 and 13 are deposited on previously oxidized zones of the plate, the other zones being free of polycrystalline silicon deposit, or the structure shown in FIG. 2 is obtained but the areas complementary to areas 11, 12 and 13 are occupied by a deposit of porous silicon. This porous silicon can be converted into silica by an oxidizing thermal treatment.

FIG. 3 shows a vertical operating V-MOS type MOS transistor with several slots. This structure contains an N+ type layer 20 or rear face of the device on which is deposited an N type epitaxial layer 21. The peripheral superficial zone of this structure contains a relatively deep P type diffusion 22 covered in part at least by a thick oxide layer 23. This peripheral layer 23 is itself covered with a peripheral layer, or a ring-shaped one, or polycrystalline silicon 24. Within the limits fixed by P type ring 22 a layer 25 of the same P type but not so thick is formed. Above this P type layer 25 is an N+ type layer 26, P type layer 25 rising in certain places 27 to the plate surface. In this structure one or more parallel V-shaped slots 30 are formed which penetrate the plate and pass through P type layer 25 to reach N type layer 21. The slot is covered with a silicon oxide layer 31, which is itself fitted with a polycrystalline silicon grid electrode 32 connected to the ring-shaped polycrystalline silicon layer 24. A metallic layer 33, which acts as source electrode, is in contact with N+ type source layer 26 and with the rising zones 27 in the intermediate P type layer 25. This metallic layer, of aluminium for example, is insulated from the polycrystalline silicon zones 24 and 32 forming the contact and grid electrode by a dielectric layer 34. This grid contact is picked up, for example, by a metallizing layer 35 arranged along at least one of the edges of polycrystalline silicon layer 24.

FIGS. 4 to 12 illustrate the method of manufacture in accordance with the present invention of a structure such as that in FIG. 3. In FIGS. 4 to 12 are shown, as far as possible, the same elements with the same references. References identical to those in FIG. 3 were also used when that was possible even in the case in which the layers or zones corresponding to layers or zones in FIG. 3 were at stages where they had not yet received their final configuration.

FIG. 4 shows the device after diffusion in N type epitaxial layer 21 on N+ type substrate 20 of the P+ type guard ring 22. At this level a silicon nitride layer 40 and openings 41 in the periphery are also shown. Nitride layer 40 is not generally deposited directly on the silicon but on a thin oxide layer (not shown) which enables the constraints to be limited and the attack to be stopped during engraving of the nitride layer.

In the stage shown in FIG. 5, the device undergoes an oxidizing treatment which simultaneously deepens the P+ type guard ring and protects the peripheral part of the junction under a thick oxide layer 23 (1 micron), called the field oxide. The growth of oxide layer 23 is prevented in the regions protected by the nitride. After this annealing, the nitride layer is engraved to fix openings 42 in which the slots are to be made (two in the example shown).

FIG. 6 which, like FIGS. 4 to 12, shows a sectional view along a plane perpendicular to the slot direction shows the stage of forming the slots 30, then the thermal oxidation to form an oxide layer 31 on the slot faces, this thermal oxidation being limited to the hollowed zones not covered with silicon nitride. For a better understanding of how the slots are limited longitudinally, reference may be made to FIGS. 13 and 14 which show sectional views along planes perpendicular to the main face of the plate and parallel to the slot direction, the section of FIG. 13 being made outside the slots and the one of FIG. 14 along the axis of a slot. In classical fashion, the slot walls correspond to planes which limit the anisotropic attack and are respectively in the N type regions laterally and in the guard ring longitudinally at the end of the slot.

FIGS. 7 and 8 show two further stages of the method which correspond to the method by anodizing the polycrystalline silicon deposit on the silica layers which was described in connection with FIGS. 1 and 2.

As FIG. 7 shows, when the nitride layer 40 has been eliminated, a layer of undoped polycrystalline silicon 43 is deposited. Layer 43 rests on the silicon in the regions which were protected by the nitride layer and on the oxide at the periphery and in the slots. If a thin layer (500 Å) of silica was originally formed before the deposit of nitride layer 40, this layer will be attacked before the deposit of the polycrystalline silicon layer. This attack is made, for example, without masking by utilizing the differences in thickness of the oxide layers formed in the slot and at the beginning.

FIG. 8 shows the stage in which the grid electrode is aligned in the slot. It is obtained by anodizing polycrystalline silicon layer 43 in the regions where this layer is deposited directly on the silicon. Anodizing of the polycrystalline silicon is done, for example, under a strong light in a 2% aqueous solution of hydrofluoric acid between a platinum electrode, which acts as cathode, and the silicon plate used as anode. Contact is made on the metallized rear face of the plate, which is held by a vacuum or by clamping in a support against a silastene gasket. By controlling the current density used and the anodizing time, either the polycrystalline silicon is attacked as shown in the figure or the silicon is converted to porous silicon at the regions in contact with the monocrystalline silicon. In the case in which porous silicon is obtained, later thermal oxidation will convert it to a porous oxide layer which is used in the rest of the method.

FIG. 9 shows the structure after implantation of the P type regions 25 where the channel will be formed. A boron implantation, for example, is made either through the porous oxide previously formed or on the bare silicon resulting from the preceding anodic attack. This implantation is masked by a resin layer 44 at the element periphery and by the silica and polycrystalline silicon layers 23-24 and 31-32. With an adequate mask, it is possible to produce with the same implantation an additional series of guard-rings disconnected from the first, so as to spread the electric field at the element periphery. A boron dose of about $10^{14}$ at/cm$^2$ and an energy of 80 keV give good results. Annealing is done in a neutral atmosphere and an oxide layer is deposited to start with in the case in which the silicon was uncovered during the implantation.

FIG. 10 shows the engraving of the oxide layer, which was deposited earlier, to leave a peripheral oxide zone 45 and oxide plots 46 intended to provide the rising parts 27 of P type layer 25 and the diffusion of N+ type regions 26. This diffusion is jointly masked by the oxide layers which had previously limited the anodizing of the polycrystalline silicon. In particular, the doping penetrates along the slot sides and compensates for a fraction of the P type region previously diffused.

The region which, along the slot sides, remains P type in depth and corresponds to the channel of the V-MOS transistor obtained will then be automatically aligned on the ribs formed by the slot at the device surface.

Hence, contrary to the classical methods in which the slots are made after the diffusions, this method enables the alignment of the grid electrode on the slots and then the alignment of the diffusions on the electrode itself to be obtained in succession. This method is made possible by the limited oxidation of the slots (FIG. 3) and by the protection that these oxide layers provide during the anodic attack of the polycrystalline silicon.

FIGS. 11 and 12 show classical stages of deposit and engraving of an insulating layer 34 placed between the grid electrode and the metallizations (FIG. 11) and then the deposit and engraving of the metallizations (FIG. 12).

In FIG. 12 can be seen the metallizing of source 33 and in FIGS. 15 and 16, which are longitudinal sectional views corresponding to the final stage of FIG. 12, the longitudinal section of FIG. 15 being made between two slots and the one in FIG. 16 in a slot, the metallizations of source 33 and grid 35 can be seen.

The procedure described above can also be applied with a substrate orientation (110) instead of (100). In this case, the slots have vertical sides and it is then possible to reduce even more the spacing of the interdigital structure. The limited oxidation of the sides is always possible and the deposit of the polycrystalline silicon layer may even allow, for narrow slots (2 microns) and suitable conditions, satisfactory filling of the latter. In this case, a planar field effect transistor structure is obtained with very high transconductances per unit of surface (spacing <10 microns) $g_m \simeq 1$ A/V/mm$^2$. For these transistors, the drain resistance depends, not on the grid/source structure spacing, but only on the thickness and resistivity of the epitaxial layer. It is possible to optimize the element perfectly and get the maximum from the silicon used by obtaining high conductances and transconductances simultaneously.

In the preceding explanation, the stages in the formation of the contact metallizations have only been very briefly described in connection with FIGS. 11 and 12. It may be noted that, for these metallizations also, a self-aligning procedure can be used. Such a procedure will be described and illustrated in connection with FIGS. 17 to 19.

After the stage shown in FIG. 10, instead of making a partial oxidation of the structure as shown in FIG. 11, the surface of the devices is subject to complete oxide removal and a layer of silicon nitride 50 is deposited (FIG. 17). In the stage shown in FIG. 18, the nitride layer is subjected to anodic oxidation and the nitride converted into silicon oxide in the regions where it is thinnest and where it is not deposited on a silicon layer covered with polycrystalline silicon. Regions 51, 52, 53 and 54 shown in FIG. 18 over the slots and the guard ring are obtained together with a silica layer 55 at complementary positions on the plate surface.

As shown in FIG. 19, oxide layer 55 is then removed. As an example, it may be noted that, with a 160 Volt supply delivering 70 mA in an ethyleneglycol bath and a 4 gm per liter solution of KNO$_3$ at the ambient temperature, the conversion to silica of a layer of Si$_3$N$_4$ which is 600 Å thick can be obtained by limiting the voltage to 100 V to allow for the resistance to voltage of the thin oxide regions existing for example over the slots.

The present invention is not limited to the embodiments which have been explicitly described above. It includes the variants and generalizations included in the field of the following claims.

I claim:

1. A method for the localized formation of polycrystalline silicon layers on silica covered zones of a silicon plate, comprising the following steps:
   depositing a substantially uniform layer of polycrystalline silicon on a first face of the plate having zones covered with silica,
   anodizing the plate by placing it in an acid bath that is an aqueous solution of 2 to 15% hydrofluoric acid and providing an electric current in this bath between a second face of the plate and an electrode placed in the bath to remove the polycrystalline silicon from zones of the first face of the plate not covered with silica.

2. A method as in claim 1, wherein the step of anodizing comprises the step of anodizing in the presence of light.

3. A method for manufacturing a non planar MOS transistor structure from a silicon plate, comprising the following successive steps:
   (a) forming slots in the plate and covering them with a layer of silicon oxide,
   (b) depositing a substantially uniform layer of polycrystalline silicon on a first face of the plate including the slots and anodizing the plate by placing it in an acid bath and circulating a current in this bath between a second face of the plate and an electrode placed in the bath to remove the polycrystalline silicon from those areas of the plate not having a silicon oxide layer, (c) successively implanting, diffusing and masking using the polycrystalline silicon formed on the silica as a limit to the implantation mask on one side and on the other of the slots to obtain a classical non planar MOS transistor structure, and (d) applying metallizings and connections.

4. A method as in claim 3, wherein step (a) comprises the following stages:

depositing a silicon nitride layer on the plate, opening this nitride layer in places where the slots are required, attacking the plate by an anisotropic etching agent, thermally treating to oxidize the apparent surface of the slots.

5. A method as in claim 4, wherein step (d) of metallizing formation comprises the steps of:

depositing a uniform silicon nitride layer, converting to silica by anodization of the thinnest nitride layer parts which rest directly on the positions in the plate where the semiconductor was bare before the nitride deposit, removing the silica by chemical attack, depositing a metallizing layer.

6. A method as in claim 3, further including before step (a), the step of providing a diffused guard ring surrounding the MOS transistor of the opposite type to that of the plate is formed in the plate, this guard ring being partly covered on its outer periphery with a silica layer, and wherein, during step (b), a polycrystalline silicon layer is formed on said silica ring layer at the same time as is formed a polycrystalline silicon grid layer over the slots, these two polycrystalline silicon layers being connected together.

* * * * *